United States Patent [19]

Atherton et al.

[11] Patent Number: 4,521,727
[45] Date of Patent: Jun. 4, 1985

[54] HALL EFFECT CIRCUIT WITH TEMPERATURE COMPENSATION

[75] Inventors: James H. Atherton; Silvo Stanojevic, both of Freeport, Ill.

[73] Assignee: Honeywell Inc.

[21] Appl. No.: 497,311

[22] Filed: May 23, 1983

[51] Int. Cl.³ .......................................... H03K 17/90
[52] U.S. Cl. ................................... 323/294; 307/309; 323/368; 323/907
[58] Field of Search ................... 323/294, 315-317, 323/907, 368; 307/309; 324/117 H

[56] References Cited

U.S. PATENT DOCUMENTS

| | | | |
|---|---|---|---|
| 3,250,995 | 5/1966 | Kalinowski et al. | 307/309 |
| 3,435,332 | 3/1969 | Kurdyla | 323/368 |
| 3,994,010 | 11/1976 | Geske | 357/27 |
| 4,134,030 | 1/1979 | Pace | 307/309 |
| 4,393,317 | 7/1983 | Radziwill | 307/309 |
| 4,443,716 | 4/1984 | Avery | 323/294 |

FOREIGN PATENT DOCUMENTS 1247955  9/1971  United Kingdom .

OTHER PUBLICATIONS

Maupin et al., "The Hall Effect in Silicon Circuits", paper presented at The Hall Effect; A Commemorative Symposium, John Hopkins University, (Nov. 13, 1979).
Bolash et al., "Monolithic Hall Cell System, " IBM Tech. Discl. Syst., vol. 21, No. 7, pp. 2717, 2718, Dec. 1978.

*Primary Examiner*—William H. Beha, Jr.
*Attorney, Agent, or Firm*—Charles L. Rubow

[57] ABSTRACT

A temperature compensation method and circuit for a Hall element or other element with similar characteristics comprising a pair of current carrying branches, one of which includes a resistor. A pair of transistors in the branches are controlled in unison to control the sum of the currents in the branches in response to current through the element, and controlled differentially to control the relative magnitudes of the currents in the branches in response to the voltage generated by the element. A comparator circuit including an active load in the branches compares the branch currents and provides a switched output signal upon a predetermined relationship between the currents. Switching hysteresis is provided by changing the sum of the currents depending on the state of the output signal.

17 Claims, 2 Drawing Figures

U.S. Patent   Jun. 4, 1985   4,521,727
FIG. 1
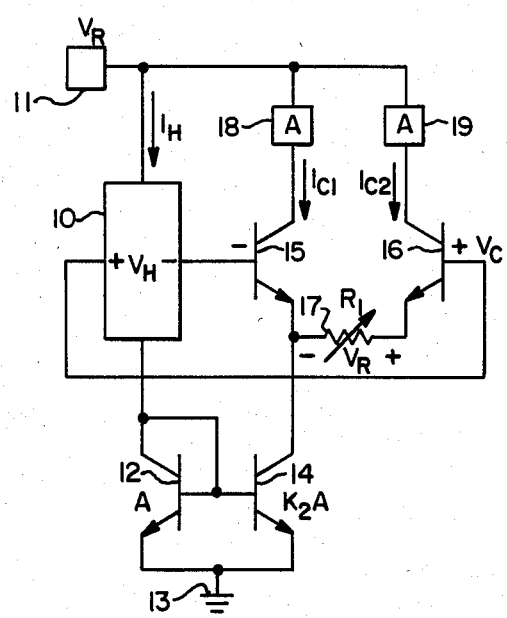
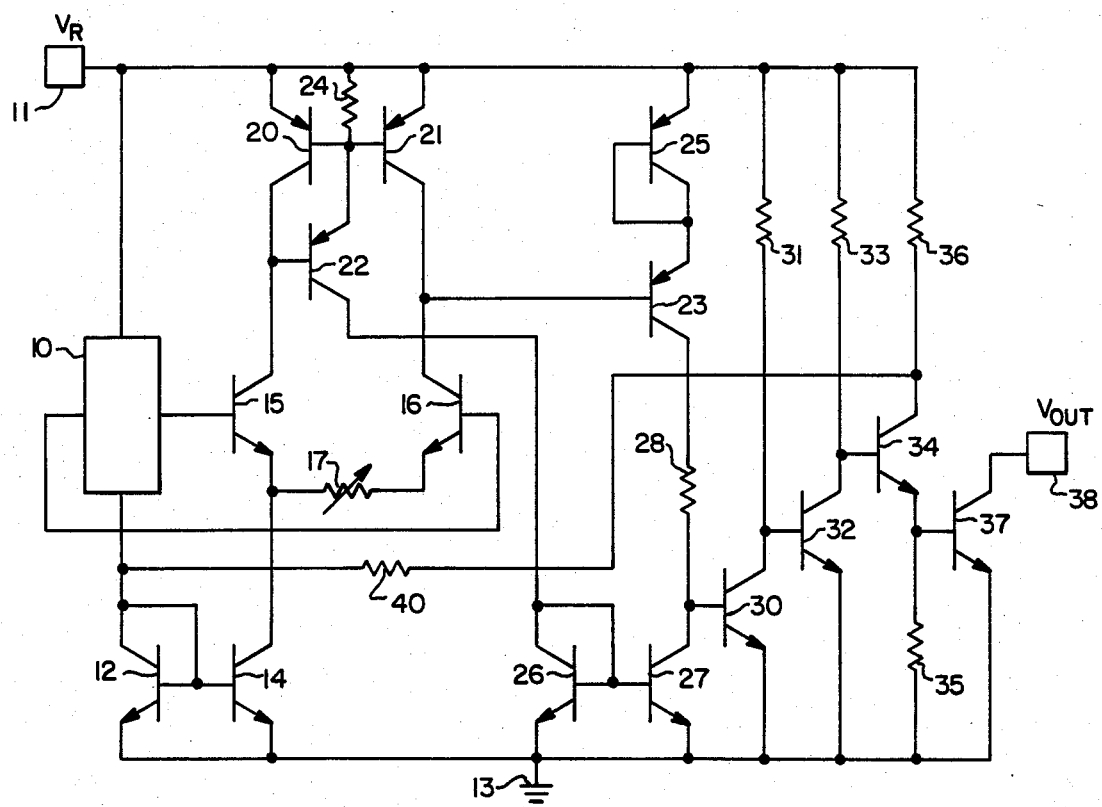
FIG. 2

HALL EFFECT CIRCUIT WITH TEMPERATURE COMPENSATION

BACKGROUND OF THE INVENTION

The invention disclosed herein relates generally to a method and means for providing temperature compensation for elements whose sensitivity is a function of electric current therethrough, and more particularly to a method and circuitry for compensating for the temperature dependence of the sensitivity of Hall effect elements and other elements with similar characteristics.

The Hall effect is being used to an increasing extent for measuring, controlling and regulating purposes. For example, in combination with a voltage amplifier, a Hall effect element may be used as a stable signal generator or as a switch or boundary value indicator which functions without physical contact. The theory of operation of a Hall effect generator is well-known. The effect may be generally described as follows. If a block or sheet of suitable material having orthogonal axes x, y and z is fitted with a pair of input electrodes such that a current flows along the x axis, and if a magnetic field is passed through the material generally parallel to the y axis, then a Hall voltage will be produced across the material in the direction of the z axis. A pair of output electrodes may be connected to the material such that the Hall voltage can be applied to an output circuit.

Materials suitable for Hall effect generators generally exhibit large increases in resistance with increasing temperature. The same is true for certain other materials sensitive to magnetic fields, such as permalloy. Thus, a fixed voltage applied to a Hall or other similar element results in a current therethrough which decreases rapidly with increasing temperature. Partially as a result of the decreasing current and partially as a result of the greater portion of the Hall voltage which is dropped internally the output voltage of the Hall element also decreases. This large negative temperature coefficient is manifested as a reduction in sensitivity as temperature increases. In many applications a large variation in sensitivity cannot be tolerated, or is at least undesirable. In such applications it is necessary to provide means for compensating for the temperature dependence.

A variety of circuits and apparatus have been devised for compensating for the temperature dependent characteristics of a Hall element. For example, British Pat. No. 1,247,955 discloses Hall effect apparatus in which it is attempted to provide temperature independent sensitivity, in part by maintaining a constant current through a Hall element by connecting large value resistors in series therewith. The apparatus also includes an output circuit in which the internal resistance of the Hall element forms a part of a feedback network for a differential amplifier.

Maintaining a constant current through a Hall element may not be feasible in some situations. Also, the Hall element in British Pat. No. 1,247,955 is described as having decreasing resistance with increasing temperature which is generally opposite to the temperature response of known Hall effect materials. Operation of the output circuit appears to depend on this unconventional temperature dependence. Finally, the Hall element and compensation circuit disclosed in the patent are not well adapted to manufacture by the most common present monolithic integrated circuit fabrication processes.

A mechanical arrangement for providing temperature compensation for a Hall effect device is shown in U.S. Pat. No. 3,435,332 issued to N. Kurdlya on Mar. 25, 1969. In this arrangement, the magnetic structure which provides flux for the Hall element is mounted in apparatus which varies the air gap and, hence, the flux concentration with temperature so as to compensate for variations in Hall element sensitivity. This arrangement is mechanically complex, and therefore also undesirable for many present applications.

The applicants have provided a unique temperature compensation method and circuit which is simple and applicable to various elements of the type whose sensitivity is a function of electric current therethrough. It is also readily manufactured with elements, such as Hall elements, in monolithic integrated circuit form by common integrated circuit fabrication processes.

SUMMARY OF THE INVENTION

The present invention is a method and circuit which compensates for the variable sensitivity of a Hall element (or other element with similar characteristics) by means of a voltage reference that tracks the Hall voltage over temperature. The Hall voltage is then compared with the reference voltage and an output signal is produced based on the relative magnitudes of the voltages. The reference voltage may be generated by producing a current proportional to the current through the Hall element and passing this current through an impedance device. The circuit for generating the reference voltage may include first and second current conducting branches, one of which contains the impedance device, means for controlling the sum of the currents through the branches in accordance with the current through the Hall element, and means for differentially controlling the currents in the branches in accordance with the Hall voltage.

BRIEF DESCRIPTION OF THE DRAWINGS

FIG. 1 is a partially block and partially schematic drawing of a Hall element and associated temperature compensation circuit in accordance with the applicants' invention; and FIG. 2 is a schematic circuit diagram of a preferred embodiment of a Hall element and associated temperature compensation circuit in accordance with the applicants' invention.

DESCRIPTION OF THE PREFERRED EMBODIMENT

In the drawing of FIG. 1, reference numeral identifies a Hall effect element or other element exhibiting similar characteristics. For convenience in describing the present invention, the element will be referred to as a Hall element.

The Hall element produces an output voltage given by the equation $$V_H = V_{HO} + K_1 I_H B \tag{1}$$

where $V_{HO}$ is the Hall offset voltage, $K_1$ is a temperature independent constant, and B is magnetic flux density. This voltage has a large negative temperature coefficient since $I_H$ decreases rapidly with increasing temperature. Accordingly, the Hall element sensitivity ($K_1 I_H$) also decreases rapidly with increasing temperature. Compensation for decreasing sensitivity can be provided by constructing a voltage reference that tracks the Hall output voltage over temperature.

The circuit shown in FIG. 1 illustrates a concept for incorporating such a reference into a comparator. A fixed voltage is supplied to Hall element 10 and the remainder of the circuit through a supply terminal 11. Element 10 is connected between terminal 11 and the collector of an NPN transistor 12 whose emitter is connected to a source of reference potential or ground 13. Transistor 12 is part of a current mirror which also includes an NPN transistor 14 whose emitter is connected to ground 13. The bases of the transistors are connected together and to the collector of transistor 12. Accordingly, a current through transistor 12 results in a proportional current through transistor 14. The constant of proportionality $K_2$ depends on design parameters of the transistors.

The Hall output voltage of element 10 is applied between the bases of a pair of NPN transistors 15 and 16. The emitter of transistor 15 is connected directly to the collector of transistor 14, and the emitter of transistor 16 is connected to the collector of transistor 14 through a variable resistor 17. The current through transistor 14 is the sum of currents $I_{C1}$ and $I_{C2}$ through transistors 15 and 16 respectively. The magnitude of current $I_{C2}$ relative to $I_{C1}$ depends on the resistance of resistor 17 and the differential base drive voltage provided to transistors 15 and 16 by Hall element 10. As shown in FIG. 1, currents $I_{C1}$ and $I_{C2}$ are supplied through supply terminal 11 and are detected by current detectors 18 and 19 respectively.

The comparator input voltage required to cause current $I_{C1}$ to equal current $I_{C2}$ is given by the equation $$V_C = \Delta V_{BE} + \frac{K_2 I_H R_1}{2} \quad (2)$$

where $\Delta V_{BE}$ is the difference in the base to emitter voltages of transistors 15 and 16, $K_2$ is a temperature independent constant and $R_1$ is the resistance of resistor 17. Voltage $V_C$ is in essence a reference voltage against which the Hall output voltage can be compared. The temperature coefficient of the reference voltage is determined by current $I_H$. Thus, temperature tracking between the Hall output voltage and the reference voltage is assured.

Operation of the circuit can be further understood by assuming that $V_H = V_C$, and solving for the magnetic field required to balance $I_{C1}$ and $I_{C2}$. From equations (1) and (2), $$V_{HO} + K_1 I_H B = \Delta V_{BE} + \frac{K_2 I_H R_1}{2} \quad (3)$$

$$B = \frac{\Delta V_{BE} - V_{HO}}{K_1 I_H} + \frac{K_2 R_1}{2K_1} \quad (4)$$

For a circuit in which $\Delta V_{BE}$ and $V_{HO}$ are kept small, $$B \approx \frac{K_2 R_1}{2K_1} \quad (5)$$

This expression shows that the magnetic field necessary to achieve balance is independent of temperature.

It is also informative to consider the situation in which no magnetic field is applied to element 10. In this case, except for a possible offset voltage, no voltage is generated by element 10 and equal voltages are applied to the bases of transistors 15 and 16. Since the sum of currents $I_{C1}$ and $I_{C2}$ through transistors 15 and 16 is governed by current $I_H$ by virtue of operation of the current mirror (transistors 12 and 14), current $I_{C1}$ is larger than current $I_{C2}$ because the branch carrying $I_{C2}$ contains resistor 17.

As a magnetic field is applied to element 10 so as to increase the voltage at the base of transistor 16 in a positive sense and concurrently decrease the voltage at the base of transistor 15, current $I_{C2}$ increases with respect to current $I_{C1}$ until the two currents are equal. In this situation, voltage $V_R$ across resistor 17 is exactly equal to voltage $V_H$ since the emitter voltages of transistors 15 and 16 are the voltages at the ends of resistor 17 and the bases of transistors 15 and 16 are each one diode drop above the voltages at the ends of resistor 17. Accordingly, in a typical application in which a circuit output is desired when a predetermined magnetic field is applied to element 10, the output point is determined by the resistance setting of resistor 17, and the sensitivity of the circuit is independent of temperature.

FIG. 2 illustrates a practical implementation of the concept discussed in connection with FIG. 1. Additional circuitry is provided to detect the condition $I_{C1} = I_{C2}$. The output voltage $V_{out}$ will switch from high to low as the magnetic field is ramped from low to high.

In FIG. 2, the elements common to FIG. 1 are identified by the same reference numerals as in FIG. 1. The circuit of FIG. 2 further includes an active load device comprising PNP transistors 20 and 21 having their bases connected together, their emitters connected to supply terminal 11 and their collectors respectively connected to the collectors of transistors 15 and 16. The collector of transistor 20 is also connected to the bases of transistors 20 and 21 through the base-emitter electrodes of a PNP transistor 22. Transistors 20 and 21 are designed so that the collector current of transistor 21 is equal to the collector current of transistor 20.

The junction of the collectors of transistors 16 and 21 is connected to the base of a PNP transistor 23 in an arrangement symmetrical to that of transistor 22. The emitter of transistor 22 is connected to supply terminal 11 through a resistor 24. The emitter of transistor 23 is connected to supply terminal 11 through a PNP transistor 25 whose collector is shorted to its base. The collectors of transistors 22 and 23 are connected to terminals of a current mirror comprising NPN transistors 26 and 27 whose bases are connected to the collector of transistor 26 and whose emitters are connected to ground 13. More specifically, the collector of transistor 22 is connected directly to the collector of transistor 26 and the collector of transistor 23 is connected to the collector of transistor 27 through a resistor 28. The current mirror comprising transistors 26 and 27 is designed such that the collector current of transistor 27 is equal to the collector current of transistor 26.

The collector of transistor 27 is also connected to the base of an NPN transistor 30 whose emitter is connected to ground 13 and whose collector is connected to supply terminal 11 through a resistor 31. Similarly, the collector of transistor 30 is connected to the base of an NPN transistor 32 whose emitter is connected to ground 13 and whose collector is connected to supply terminal 11 through a resistor 33. The collector of transistor 32 is connected to the base of an NPN transistor 34 whose emitter is connected to ground 13 through a resistor 35 and whose collector is connected to supply terminal 11 through a resistor 36. The emitter of transistor 34 is connected to the base of an NPN transistor 37 whose emitter is connected to ground 13 and whose collector is connected to an output terminal 38. Finally, the collector of transistor 34 is connected to the junction between Hall element 10 and the current mirror comprising transistors 12 and 14 through a resistor 40.

In order to understand the operation of the circuit of FIG. 2, assume that the collector currents of transistors 23 and 27 are equal. That condition results in an indeterminate base drive for transistor 30, which is the nominal switching point for the following circuitry. The collector current of transistor 27 is equal to the collector current of transistor 26 by virtue of the current mirror connection, which in turn is equal to the collector current of transistor 22. Equal collector currents for transistors 22 and 23 imply equal base voltages for the transistors, assuming that the transistors are identical. This implies that the collector currents of transistors 15 and 20 and 16 and 21 are equal. The circuit is thus in a balanced condition.

Now assume that the magnetic field applied to Hall element 10 is slightly vaired so as to increase the voltage on the base of transistor 15 and decrease the voltage on the base of transistor 16. This will increase the collector current of transistors 15 and 20. The collector current of transistor 20 is mirrored to the collector of transistor 21. The increased collector current is reflected as an increased voltage at the base of transistor 23, thus decreasing conduction through the transistor and decreasing the voltage at the base of transistor 30 so as to decrease conduction therethrough. Turning transistor 30 OFF tends to turn transistor 32 ON which tends to turn transistor 34 OFF which turns transistor 37 OFF so as to provide a high voltage state at output terminal 38. Converse operation of the circuit occurs when the magnetic field applied to element 10 is varied so as to increase the voltage at the base of transistor 16 and decrease the voltage at the base of transistor 15. In accordance with the foregoing discussion, the circuit provides for temperature independent switching of output signal state based only on the magnetic flux applied to element 10.

Turning transistor 34 OFF increases the voltage at its collector which increases current through resistor 40 from the junction between element 10 and transistor 12. The resulting increased collector current of transistor 12 increases the collector current of transistor 14 and the voltage across resistor 17 required to achieved switching of the circuit output. Thus, switching hysteresis is provided.

Resistor 24 functions to guarantee sufficient emitter current for transistor 22 so that the circuit will operate even through the betas of transistors 20 and 21 are sufficiently high that the base currents of the transistors are not adequate to supply the required emitter current. Transistor 25 insures that the bases of transistors 22 and 23 are at the same voltage, i.e., two base-emitter voltage drops below the supply voltage, to provide complete comparator circuit balance.

The applicants have thus devised a unique method and circuit for providing temperature compensation for elements whose sensitivity is a function of electric current therethrough. The circuit has particular applicability to Hall effect elements and other elements exhibiting similar characteristics. A particular circuit embodiment is shown for illustrative purposes. However, various modifications will be apparent to those skilled in the relevant arts. It is not intended that coverage be limited to the disclosed embodiment, but only by the terms of the following claims.

The embodiments of the invention in which an exclusive property or right is claimed are defined as follows:

1. A circuit for providing a temperature independent switched output responsive to magnetic field strength comprising:
   a Hall effect element having a pair of bias terminals located along a first axis providing for an electrical current therebetween and a pair of output terminals located along a second axis perpendicular to the first axis between which a Hall voltage is generated when said Hall effect element is subjected to a magnetic field having a component along a third axis perpendicular to the first and second axes;
   power supply means for supplying a voltage between a supply conductor and a ground conductor;
   first connecting means connecting said Hall effect element through its bias terminals between the supply conductor and the ground conductor;
   first and second current carrying branches, one of which includes an impedance device;
   first control means for controlling the sum of the currents carried by said first and second branches in response to the current through said Hall effect element;
   second control means for differentially controlling the currents carried by said first and second branches in response to the Hall voltage; and
   comparison means including an active load device operating such that a current of predetermined magnitude between first and second terminals thereof results in a current of the same magnitude between first and third terminals thereof, the first terminal being connected to the supply conductor and the second and third terminals comprising portions of said second and first branches respectively, said comparison means being operable to produce an output signal dependent on the relative magnitudes of the Hall voltage and the reference voltage and producing a switched output upon occurrence of a predetermined relationship between the Hall and reference voltages.

2. The circuit of claim 1 wherein a first current mirror forms a portion of said first connecting means and said first control means, said first current mirror operating such that a current of a predetermined magnitude between first and second terminals thereof results in a current of proportional magnitude between first and third terminals thereof, the first, second and third terminals being connected to the ground conductor, a bias terminal of said Hall effect element and a junction of said first and second branches respectively.

3. The circuit of claim 2 wherein said second control means comprises first and second current control transistors in said first and second branches respectively and means for applying the Hall voltage between the control electrodes of said first and second transistors.

4. The circuit of claim 3 wherein the impedance device comprises a resistor connected between said first current control transistor and the junction of said first and second branches.

5. The circuit of claim 4 wherein said comparison means further includes:
   a second current mirror operating such that a current of predetermined magnitude between first and second terminals thereof results in a current of the same magnitude between first and third terminals thereof, the first terminal being connected to the ground conductor;

third and fourth transistors having these electrodes connected to the second and third terminals respectively of said active load device, each of said third and fourth transistors each having collector and emitter electrodes;

second connecting means connecting said third and fourth transistors through their collector and emitter electrodes between said supply conductor and the second and third terminals respectively of said second current mirror; and output means connected to the third terminal of said second current mirror for producing an output signal which switches from a high state to a low state when the current in said first branch increases to equal the current in said second branch, and switches from a low state to a high state when the current in said second branch increases to equal the current in said first branch.

6. The circuit of claim 5 wherein said output means is connected to the second terminal of said first current mirror so that the current through said first current mirror is changed in accordance with the state of the output signal to provide switching hysteresis.

7. A temperature compensation circuit for an element which produces a voltage whose magnitude is a function of a temperature dependent current therethrough, comprising:

bias means including supply and ground conductors for applying a voltage across said element so as to produce a current therethrough;

first and second current carrying branches, the first branch including an impedance device;

first control means for controlling the sum of the currents carried by said first and second branches in response to the current through said element;

second control means for differentially controlling the currents carried by said first and second branches in response to the voltage produced by said element; and comparison means including an active load device having first, second and third terminals, said active load device operating such that a current of a predetermined magnitude at the second terminal results in a current of the same magnitude at the third terminal, the second and third terminals comprising portions of said second and first branches respectively, said comparison means being operable to produce an output signal dependent on the relative magnitudes of the voltage produced by said element and the reference voltage.

8. The temperature compensation circuit of claim 7 wherein said first control means controls the sum of the currents carried by said first and second branches to be proportional to the current through said element.

9. The temperature compensation circuit of claim 8 wherein said second control means comprises:

first and second current control transistors in said first and second branches respectively and means for applying the voltage produced by said element between control electrodes of said first and second transistors.

10. The temperature compensation circuit of claim 9 wherein said first control means comprises:

a first current mirror having first, second and third terminals, said first current mirror operating such that a current of a predetermined magnitude at the second terminal results in a current of proportional magnitude at the third terminal; and first connecting means connecting the second terminal of said first current mirror to said element so that the current through said element flows through the second terminal, and connecting the third terminal to a junction between said first and second branches.

11. The temperature compensation circuit of claim 10 wherein the impedance device in said first branch comprises a resistor connected between said first current control transistor and the junction of said first and second branches.

12. The temperature compensation circuit of claim 11 further including:

third and fourth transistors each having collector, emitter and base electrodes, the base electrodes being connected to the second and third terminals respectively of said active load device;

a second current mirror having first, second and third terminals, said second current mirror operating such that a current of a predetermined magnitude at the second terminal results in a current of the same magnitude at the third terminal;

second connecting means connecting said third transistor through its collector and emitter electrodes between said supply conductor and the second terminal of said second current mirror; and third connecting means connecting said fourth transistor through its collector and emitter terminals between said supply conductor and the third terminal of said second current mirror.

13. The temperature compensation circuit of claim 12 wherein said third connecting means includes a resistor connecting said fourth transistor to the third terminal of said second current mirror.

14. The temperature compensation circuit of claim 13 wherein said active load device and said third transistor are connected such that said active load device provides a base-emitter voltage drop between the supply conductor and the emitter of said third transistor; and said third connecting means includes a fifth transistor connected to provide a base-emitter voltage drop between the supply conductor and the emitter of said fourth transistor.

15. The temperature compensation circuit of claim 14 further including:

switching amplifier means having a control electrode connected to the third terminal of said second current mirror, whereby said switching amplifier means provides an output signal which switches to a first state when the current in said first branch increases to equal the current in said second branch, and switches to a second state when the current in said second branch increases to equal the current in said first branch; and fourth connecting means connecting said switching amplifier means to the second terminal of said first current mirror, whereby the bias voltage across said element is altered in accordance with the state of the output signal of said switching amplifier means to provide switching hysteresis.

16. A method for providing sensitivity compensation in a switching circuit including an element which produces a voltage whose magnitude is a function of electric current through the element, comprising the steps of:

establishing a current which is controlled by the current through said element to be proportional thereto;

splitting said current into first and second portions;

supplying the first and second portions of said current separately through first and second branches respectively, the first branch including an impedance device having a voltage thereacross depending on the first portion of said current;

differently controlling the first and second portions of said current in response to the voltage produced by said element;

detecting the relative magnitudes of the first and second portions of said current;

switching an output signal to a first state when the first portion of said current increases to a magnitude equal to the magnitude of the second portion of said current, and to a second state when the second portion of said current increases to a magnitude equal to the magnitude of the first portion of said current; and altering said current according to the state of the output signal to provide switching hysteresis.

17. The method of claim 16 wherein said current is reduced when the output signal switches to the state caused by the first portion of said current increasing to equal the second portion of said current, and is increased when the output signal switches to the state caused by the second portion of said current increasing to equal the first portion of said current.

* * * * *

UNITED STATES PATENT AND TRADEMARK OFFICE
CERTIFICATE OF CORRECTION

PATENT NO. : 4,521,727
DATED : JUNE 4, 1985
INVENTOR(S) : JAMES H. ATHERTON, ET AL.

It is certified that error appears in the above-identified patent and that said Letters Patent is hereby corrected as shown below:

Claim 5, column 7, line 5, delete "these" insert --base--.

Claim 16, column 9, line 12, delete "differently" insert --differentially--.

Signed and Sealed this

Sixth Day of May 1986

[SEAL]

Attest:

Attesting Officer

DONALD J. QUIGG

Commissioner of Patents and Trademarks